United States Patent
le Liepvre

(10) Patent No.: US 9,927,676 B2
(45) Date of Patent: Mar. 27, 2018

(54) OPTICAL DEVICE WITH INTEGRATED REFLECTOR(S) COMPRISING A LOOP REFLECTOR INTEGRATING A MACH-ZEHNDER INTERFEROMETER

(71) Applicants: Commissariat à l'Energie Atomique et aux Energies Alternatives, Paris (FR); Thales, Neuilly sur Seine (FR)

(72) Inventor: Alban le Liepvre, Marcoussis (FR)

(73) Assignees: Commissariat à l'Energie Atomique et aux Énergies Alternatives, Paris (FR); Thales, Neuilly sur Seine (FR)

( * ) Notice: Subject to any disclaimer, the term of this patent is extended or adjusted under 35 U.S.C. 154(b) by 0 days.

(21) Appl. No.: 14/964,092

(22) Filed: Dec. 9, 2015

(65) Prior Publication Data

US 2016/0170286 A1    Jun. 16, 2016

(30) Foreign Application Priority Data

Dec. 11, 2014    (EP) .................................... 14307007

(51) Int. Cl.

| | |
|---|---|
| *G02F 1/035* | (2006.01) |
| *G02F 1/225* | (2006.01) |
| *G02B 6/12* | (2006.01) |
| *G02B 6/124* | (2006.01) |
| *G02B 6/136* | (2006.01) |
| *G02F 1/01* | (2006.01) |
| *H01S 5/026* | (2006.01) |

(Continued)

(52) U.S. Cl.
CPC ........... *G02F 1/2257* (2013.01); *G02B 6/124* (2013.01); *G02B 6/12007* (2013.01); *G02B 6/12016* (2013.01); *G02B 6/136* (2013.01); *G02B 6/29338* (2013.01); *G02F 1/0147* (2013.01); *H01S 5/026* (2013.01); *H01S 5/0651* (2013.01); *H01S 5/142* (2013.01); *H01S 5/5045* (2013.01); *G02B 6/29352* (2013.01); *G02B 2006/12061* (2013.01); *G02B 2006/12097* (2013.01); *G02F 2001/212* (2013.01)

(58) Field of Classification Search
None
See application file for complete search history.

(56) References Cited

U.S. PATENT DOCUMENTS

| | | | |
|---|---|---|---|
| 5,453,836 | A | 9/1995 | Kim |
| 5,892,869 | A | 4/1999 | Wisseman |

(Continued)

FOREIGN PATENT DOCUMENTS

EP    1 024 378    8/2000

OTHER PUBLICATIONS

European Search Report dated May 13, 2015 out of corresponding European priority Application No. EP 14 30 7007 (3 pages).

(Continued)

*Primary Examiner* — Tina Wong
(74) *Attorney, Agent, or Firm* — Brinks Gilson & Lione; G. Peter Nichols

(57) ABSTRACT

An optical device includes a substrate on which is defined at least one primary waveguide ($3_1$, $3_2$) defining a loop reflector, that has first and second directional couplers, and a Mach-Zehnder interferometer intercalated between the first and second directional couplers and arranged for compensating a wavelength dependence of the first and second directional couplers.

21 Claims, 3 Drawing Sheets

(51) Int. Cl.
  *H01S 5/065*  (2006.01)
  *H01S 5/50*  (2006.01)
  *H01S 5/14*  (2006.01)
  *G02B 6/293*  (2006.01)
  *G02F 1/21*  (2006.01)

(56) References Cited

U.S. PATENT DOCUMENTS

| | | | | |
|---|---|---|---|---|
| 6,847,759 | B2* | 1/2005 | Shibata | G02B 6/29353 385/24 |
| 6,947,642 | B2* | 9/2005 | Yamazaki | G02B 6/29343 385/14 |
| 7,010,198 | B2* | 3/2006 | Wessel | G02F 1/225 385/11 |
| 8,483,521 | B2* | 7/2013 | Popovic | G02B 6/29338 385/15 |
| 2003/0202743 | A1 | 10/2003 | Shibata | |

OTHER PUBLICATIONS

Lenz, "General Optical All-Pass Filter Structures for Dispersion Control in WDM Systems", Journal of Lightwave Technology, IEEE Service Center, vol. 17, No. 7, Jul. 1999, pp. 1248-1254, XP011029460.

Madsen, "Integrated All-Pass Filters for Tunable Dispersion and Dispersion Slope Compensation", IEEE Photonics Technology Letters, vol. 11, No. 12, Dec. 1999, pp. 1623-1625, XP011426069.

Takagi et al., "Silica-based waveguide-type wavelength-insensitive couplers (WINC's) with series-tapered coupling structure", IEEE Journal of Lightwave Technology, vol. 10, No. 12, pp. 1814, 1824, Dec. 1992.

Liepvre et al. "Widely wavelength tunable hybrid III-V/silicon laser with 45 nm tuning range fabricated using a wafer bonding technique", Group IV Photonics (GFP), 2012 IEEE 9th International Conference, pp. 54,56, Aug. 29-31, 2012.

* cited by examiner

OPTICAL DEVICE WITH INTEGRATED REFLECTOR(S) COMPRISING A LOOP REFLECTOR INTEGRATING A MACH-ZEHNDER INTERFEROMETER

This application claims priority to European Patent Application No. 14307007.6 filed on Dec. 11, 2014, the entire contents of which are incorporated herein by reference.

The present invention relates to optical devices comprising reflector(s).

BACKGROUND

As it is known by those skilled in the art, a lot of optical devices need one or more reflectors for providing their functionalities. This is notably the case of Fabry-Perot lasers, tunable lasers, RSOA ("Reflective Semiconductor Optical Amplifier"), reflective arrayed waveguide grating (or R-AWG), echelle gratings as well as more complex photonics integrated circuits (or PIC).

Actually, cleaved facets are the standard way to realize reflectors for integrated waveguides. Once these cleaved facets have received a coating they can provide a controlled level of reflection, because a fine tuning of the reflection coefficient can be set by the coating parameters (and notably the thickness and the type of material). However, this solution is not integrated and cannot be implemented within a PIC, for instance between a laser and a modulator inside an integrated laser modulator (or ILM). Furthermore, with the development of wide gain active components, broadband passive elements are now required in order to benefit from these active components. So, there is now a great demand for integrated broadband controlled reflectors. This is notably the case in widely tunable lasers where they may be used for the feedback control.

Two main solutions have been proposed for realizing integrated reflectors (or mirrors): bragg reflectors and reflective loops.

A bragg reflector consists in teeth etched in a chosen zone of a waveguide. When the index difference between the optical mode in the chosen etched zone and in the non-etched zone of the waveguide is large, a relatively broadband reflection can be achieved. However there are significant losses and a wavelength dependence that is an issue for obtaining a controlled reflection coefficient over a wide wavelength range.

A reflective loop can be realized with MMI ("MultiMode Interference") coupler(s) or directional coupler(s). An example of reflective loop comprising a directional coupler is schematically illustrated in FIG. 1. This type of reflector allows the reflection/transmission ratio to be set by means of a judicious choice of the coupling coefficient, is easier to implement compared to a bragg grating because the critical dimension is relaxed, and induces very low loss and offers performances tolerant to fabrication variations. However, it does not show a broadband behavior because of the large variation of the coupling coefficient with the wavelength.

SUMMARY

So an object of this invention is to improve the situation.

In an embodiment, an optical device comprises a substrate on which is defined at least one primary waveguide defining a loop reflector, comprising first and second directional couplers, and a Mach-Zehnder interferometer intercalated between the first and second directional couplers and arranged for compensating a wavelength dependence of these directional couplers.

So, the optical device now comprises one or more integrated broadband reflectors with low losses and offering several degrees of freedom allowing to adjust the reflection/transmission coefficient and to obtain a flat response on more than 100 nm to 500 nm.

The optical device may include additional characteristics considered separately or combined, and notably:

each primary waveguide may be a rib or strip waveguide defined onto a silicon substrate;

each rib or strip waveguide may be made of silicon;

each rib or strip waveguide may have a full thickness comprised between approximately 200 nm and approximately 500 nm, and an etched part with a local thickness comprised between approximately 50 nm and approximately 500 nm and with a width comprised between approximately 200 nm and approximately 800 nm;

the first directional coupler may have a length comprised between approximately 5 µm and approximately 200 µm, the second directional coupler may have a length comprised between approximately 5 µm and approximately 200 µm, and the Mach-Zehnder interferometer may have a length comprised between approximately 0.1 µm and approximately 2 µm;

in a first embodiment, it may comprise first and second primary waveguides, each having an input/output end, a secondary waveguide comprising a gain section intercalated between a first end, connected to the input/output end of the first primary waveguide, and a second end, a ring resonator intercalated between the second end of the secondary waveguide and the input/output end of the second primary waveguide, and a heating means defined over the ring resonator and arranged for controlling a filter peak wavelength of the ring resonator and for selecting a laser optical mode;

in a second embodiment, it may comprise first and second primary waveguides, each having an input/output end, a secondary waveguide comprising a gain section intercalated between a first end, connected to the input/output end of the first primary waveguide, and a second end, an intermediate waveguide comprising first and second ends, a first ring resonator with a wavelength spectral filtering and intercalated between the second end of the secondary waveguide and the first end of the intermediate waveguide for coupling the secondary waveguide to the intermediate waveguide, a first heating means defined over the first ring resonator and arranged for controlling a filter peak wavelength of this first ring resonator, a second ring resonator with a wavelength spectral filtering and intercalated between the second end of the intermediate waveguide and the input/output end of the second primary waveguide, and a second heating means defined over the second ring resonator and arranged for controlling a filter peak wavelength of this second ring resonator;

the first primary waveguide may be a reflector with a reflection coefficient comprised between approximately 80% and approximately 100%, and the second primary waveguide may be a reflector with a reflection coefficient comprised between approximately 10% and approximately 60% and comprising an output for delivering photons. In a variant, the second primary waveguide may be a reflector with a reflection coefficient comprised between approximately 80% and approximately 100%, and the first primary waveguide may be a reflector with a reflection coefficient comprised between approximately 10% and approximately 60% and comprising an output for delivering photons;

it may further comprise an integrated element chosen from a group comprising a semiconductor optical amplifier (or SOA), a silicon photonic modulator (or SPM), a semiconductor electro absorption modulator (EAM), a silicon photonic coherent mixer coupled to balanced photodiodes, and comprising an end connected to an output end of one of the first and second primary waveguides that is intended for delivering photons;

in a third embodiment, it may comprise at least two primary waveguides and a reflective arrayed waveguide grating or an echelle grating comprising at least one input connected to an input waveguide, at least two outputs connected respectively to output waveguides and at least two inputs/outputs connected respectively to output ends of the primary waveguides via waveguides.

BRIEF DESCRIPTION OF THE DRAWINGS

Some embodiments of an optical device in accordance with embodiments of the present invention are now described, by way of examples only, and with reference to the accompanying drawings, in which.

DETAILED DESCRIPTION

Figure 1:
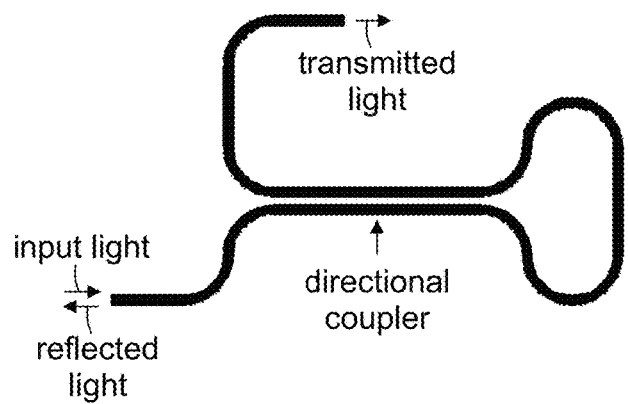
FIG. 1 schematically illustrates, in a top view, an example of loop reflector of the state of art, and FIGS. 2 to 9 schematically illustrates, in a top view, eight examples of embodiment of an optical device according to the invention.

Hereafter is notably disclosed an integrated optical device 1 comprising at least one integrated broadband reflector 3j.

Eight examples of an optical device 1 according to the invention are schematically illustrated in FIGS. 2 to 9. As illustrated, such an optical device 1 comprises a substrate 2 and at least one primary waveguide 3j defined on this substrate 2.

Each primary waveguide 3j defines a loop reflector, that comprises first 41 and second 42 directional couplers, and a Mach-Zehnder interferometer 5, that is intercalated (and integrated) between the first 4$_1$ and second 4$_2$ directional couplers and arranged for compensating a wavelength dependence of the directional couplers 4 (i=1 or 2).

So, each primary waveguide 3$_j$ can be considered as a reflective wideband wavelength insensitive coupler (or RWINC), i.e. a new type of WINC working in a reflective mode.

It is recalled that a WINC ("Wideband wavelength INsensitive Coupler") comprises two coupled waveguides defining together two directional couplers separated by a Mach-Zehnder configuration intended for compensating their wavelength dependence, but without providing any feedback into the same waveguide. Details of a WINC can be found in the document of Takagi, A; Jinguji, K.; Kawachi, M., "Silica-based waveguide-type wavelength-insensitive couplers (WINC's) with series-tapered coupling structure", IEEE Journal of Lightwave Technology, vol. 10, no. 12, pp. 1814, 1824, December 1992.

So, each primary waveguide 3$_j$ (or RWINC) offers several degrees of freedom allowing to adjust its reflection/transmission coefficient and to obtain a flat response on more than 100 nm to 500 nm. These degrees of freedom follow from the respective designs of the first 4$_1$ and second 4$_2$ directional couplers and the Mach-Zehnder interferometer 5.

For instance, each primary waveguide 3 may be a rib or strip waveguide that is defined onto a silicon substrate 2, possibly with interposition of an intermediate dielectric layer of $SiO_2$ material and possibly buried by a dielectric material.

It is recalled that a rib waveguide is a waveguide that is partially etched, and a strip waveguide is a completely etched waveguide, possibly buried by dielectric material.

In the case where the rib or strip waveguide 3$_j$ is defined onto a silicon substrate 2, it can be also made of silicon. For instance, this rib or strip waveguide 3$_j$ may have a full thickness (in its non-etched part) comprised between approximately 200 nm and approximately 500 nm, and an etched part with a local thickness comprised between approximately 50 nm and approximately 500 nm and with a width comprised between approximately 200 nm and approximately 800 nm.

Also for instance, the first directional coupler 4$_1$ may have a length comprised between approximately 5 μm and approximately 200 μm, the second directional coupler 4$_2$ may have a length comprised between approximately 5 μm and approximately 200 μm, and the Mach-Zehnder interferometer 5 may have a length comprised between approximately 0.1 μm and approximately 2 μm.

The intervals of values given in the two last paragraphs contain values allowing to control the power reflection/transmission of each primary waveguide 3$_j$ in combination with its shape.

As an example, for obtaining an input power reflection equal to 20%, the full thickness of the rib waveguide may be approximately equal to 300 nm, the rib local (or intermediate) thickness may be approximately equal to 150 nm, the rib width may be approximately equal to 550 nm, the first directional coupler length may be approximately equal to 13.29 μm, the second directional coupler length may be approximately equal to 7.35 μm, and the Mach-Zehnder interferometer length may be approximately equal to 0.267 μm.

The values given in the last paragraph allow a working at a center wavelength of 1.3 μm on a wavelength window covering approximately 200 nm from approximately 1200 nm to approximately 1400 nm, with transmission and reflection power variations remaining under 0.1 dB.

It is important to note that the RWINC 3j is robust against the fabrication variations. Indeed, when the waveguide width is increased by 10 nm (for instance from 550 nm to 560 nm), while keeping the other parameters constant, the reflection and transmission coefficients remain within 0.1 dB.

As illustrated in FIGS. 2 to 9, one or more primary waveguides 3$_2$ may be combined with one or more other integrated optical elements or components.

Figure 2:
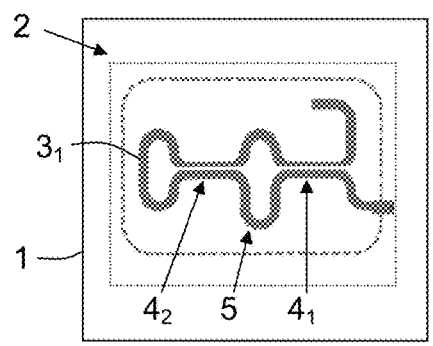

In the non-limiting first example illustrated in FIG. 2, the optical device 1 comprises a first primary waveguides 3$_1$ defining a RWINC and having an input end and an output end.

Figure 3:
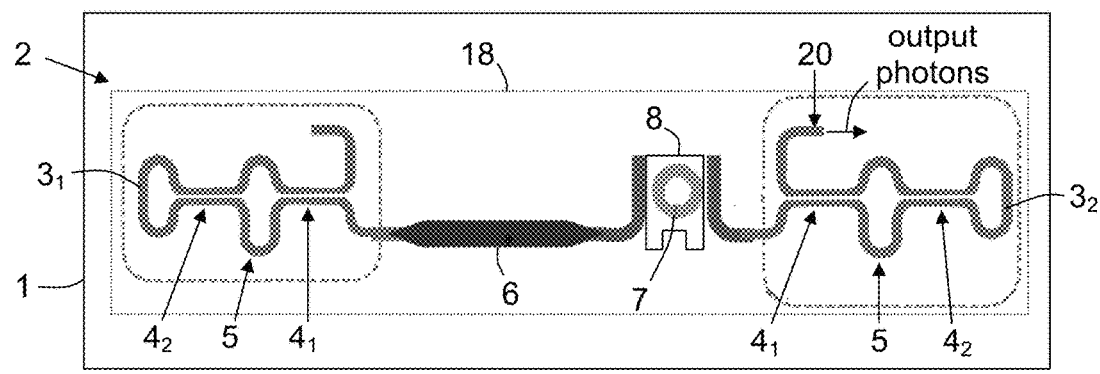
Figure 4:
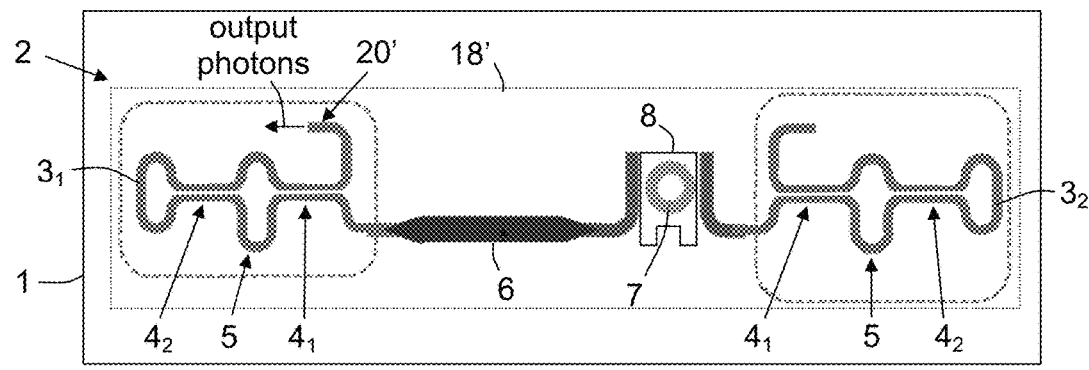

In the non-limiting second and third examples illustrated in FIGS. 3 and 4, the optical device 1 comprises first 3$_1$ and second 3$_2$ primary waveguides defining two RWINCs, a secondary waveguide 6, a ring resonator 7 and a heating means 8 in order to define a hybrid laser 18 or 18' with a broadband and controlled feedback provided by the two RWINCs 3$_j$. Each primary waveguide 3$_j$ has an input/output end. The secondary waveguide 6 comprises a gain section, for instance made of Indium Phosphide (or InP), and intercalated between first and second ends. The first end of the secondary waveguide 6 is connected to the input/output end of the first primary waveguide $3_1$. The ring resonator 7 is intercalated between the second end of the secondary waveguide 6 and the input/output end of the second primary waveguide $3_2$. The heating means 8 is defined over the ring resonator 7 and is arranged for controlling the filter peak wavelength of the ring resonator 7 and for selecting a laser optical mode.

In the non-limiting example illustrated in FIG. 3, the first primary waveguide $3_1$ is a reflector with a reflection coefficient comprised between approximately 80% and approximately 100%, while the second primary waveguide $3_2$ is another reflector with a reflection coefficient comprised between approximately 10% and approximately 60% and that comprises an output 20 for delivering photons generated by the hybrid laser 18. For instance, the reflection coefficient of the second primary waveguide $3_2$ may be equal to 30%.

In the non-limiting example illustrated in FIG. 4, the second primary waveguide $3_2$ is a reflector with a reflection coefficient comprised between approximately 80% and approximately 100%, while the first primary waveguide $3_1$ is another reflector with a reflection coefficient comprised between approximately 10% and approximately 60% and that comprises an output 20' for delivering photons generated by the hybrid laser 18'. For instance, the reflection coefficient of the first primary waveguide $3_1$ may be equal to 30%.

In the non-limiting examples illustrated in FIGS. 3 and 4, the laser cavity includes one gain section and one ring resonator (RR) acting as a filter for single mode selection. In the configuration of FIG. 3, the RWINC partial reflector for the output is located after the ring resonator RR. In the configuration of FIG. 4, the RWINC partial reflector for the output is located after the gain section. In the configuration of FIG. 3, the side mode suppression ratio (SMSR) is expected to be better than in the configuration of FIG. 4, but the output power is expected to be lower.

Figure 5:
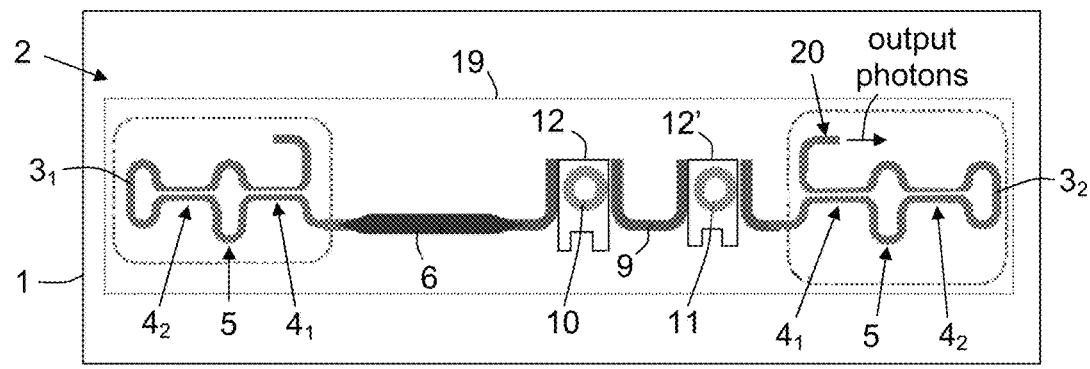
Figure 6:
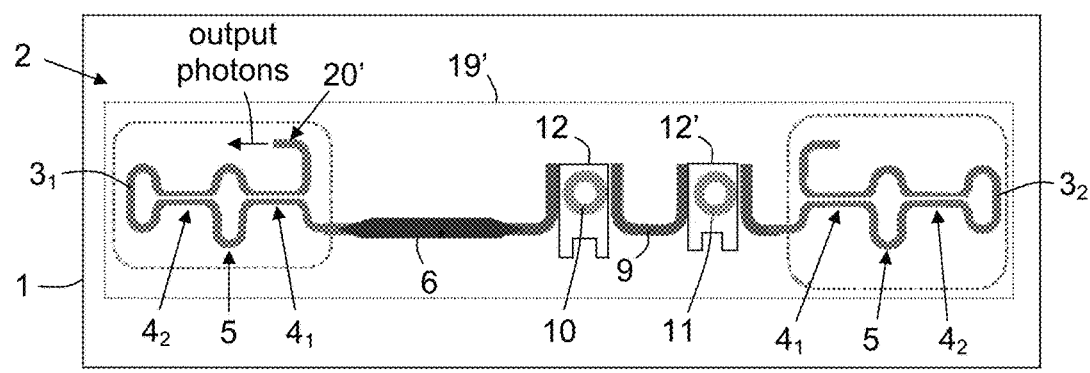

In the non-limiting fourth and fifth examples illustrated in FIGS. 5 and 6, the optical device 1 comprises first $3_1$ and second $3_2$ primary waveguides defining two RWINCs, a secondary waveguide 6, an intermediate waveguide 9, a first ring resonator 10 acting as a filter, a second ring resonator 11 acting as a filter, and first 12 and second 12' heating means to respectively tune the first 10 and second 11 ring resonators in order to define another hybrid laser 19 or 19' with a broadband and controlled feedback provided by the two RWINCs $3_j$. Each primary waveguide $3_j$ has an input/output end. The secondary waveguide 6 comprises a gain section, for instance made of Indium Phosphide (or InP), and intercalated between first and second ends. The first end of the secondary waveguide 6 is connected to the input/output end of the first primary waveguide $3_1$. The intermediate waveguide 9 comprises first and second ends. The first ring resonator 10 is intercalated between the second end of the secondary waveguide 6 and the first end of the intermediate waveguide 9 for coupling this secondary waveguide 6 to this intermediate waveguide 9. The heating means 12 is defined over the first ring resonator 10 and is arranged for controlling the peak wavelength of this first ring resonator 10. The second ring resonator 11 is intercalated between the second end of the intermediate waveguide 9 and the input/output end of the second primary waveguide $3_2$. The heating means 12' is defined over the second ring resonator 11 and is arranged for controlling the peak wavelength of this second ring resonator 11. Coordinated tuning of both first 10 and second 11 ring resonators filters allow for single mode selection and laser wavelength tuning.

The use of first 10 and second 11 ring resonators filters can allow for a larger tuning range and a better side mode suppression ratio (SMSR) for the laser. Usually, the first 10 and second 11 ring resonators have a slightly different Free Spectral Range (FSR) resulting in a composite filter with very large FSR. Vernier effect is being used to obtain large tuning ranges. Hyrbid laser making use of this filtering technique to obtain a wide tuning range are described in Le Liepvre, A.; Jany, C.; Accard, A.; Lamponi, M.; Poingt, F.; Make, D.; Lelarge, F.; Fedeli, J.-M.; Messaoudene, S.; Bordel, D.; Duan, G.-H., "Widely wavelength tunable hybrid III-V/silicon laser with 45 nm tuning range fabricated using a wafer bonding technique", Group IV Photonics (GFP), 2012 IEEE 9th International Conference, pp. 54, 56, 29-31 Aug. 2012.

In the non-limiting example illustrated in FIG. 5, the first primary waveguide $3_1$ is a reflector with a reflection coefficient approximately equal to 100%, while the second primary waveguide $3_2$ is another reflector with a reflection coefficient comprised between approximately 10% and approximately 60% and that comprises an output 20 for delivering photons generated by the hybrid laser 19. For instance, the reflection coefficient of the second primary waveguide $3_2$ may be equal to 30%.

In the non-limiting example illustrated in FIG. 6, the second primary waveguide $3_2$ is a reflector with a reflection coefficient approximately equal to 100%, while the first primary waveguide $3_1$ is another reflector with a reflection coefficient comprised between approximately 10% and approximately 60% and that comprises an output 20' for delivering photons generated by the hybrid laser 19'. For instance, the reflection coefficient of the first primary waveguide $3_1$ may be equal to 30%.

Figure 7:
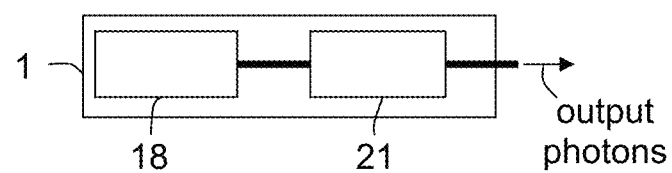
Figure 8:
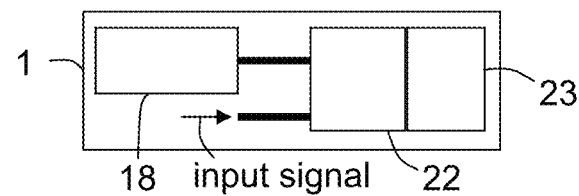

In the non-limiting sixth and seventh examples illustrated in FIGS. 7 and 8, the optical device 1 comprises a hybrid laser 18, 18', 19 or 19' (such as the ones illustrated in FIGS. 3 to 6) combined with an integrated element that may be chosen from a group comprising a semiconductor optical amplifier (or SOA) 21, a silicon photonic modulator (or SPM) 21 or a semiconductor electro absorption modulator (EAM) 21, and a silicon photonic coherent mixer 22 coupled to balanced photodiodes 23, for instance. Each integrated element comprises an end connected to an output end delivering photons and belonging to one of the first $3_1$ and second $3_2$ primary waveguides of the hybrid laser 18, 18', 19 or 19'. The hybrid laser could be also of the Fabry-Perot type, notably in the case where it is coupled to a silicon photonic modulator.

The use of RWINCs $3_j$ in a tunable laser allows a robustness of fabrication, broadband performances in low loss and flat response, and a controlled reflectivity.

Figure 9:
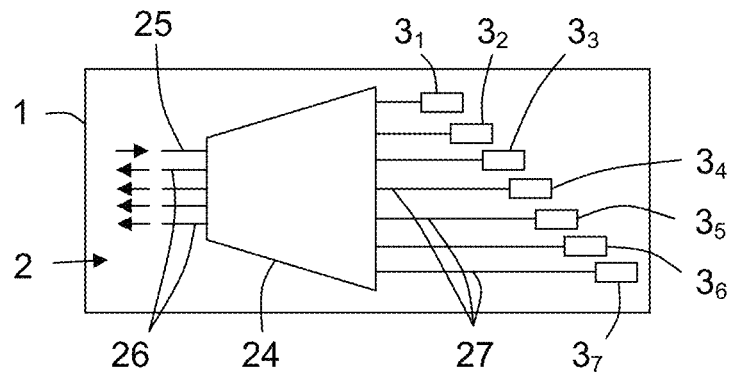

In the non-limiting eighth example illustrated in FIG. 9, the optical device 1 comprises at least two primary waveguides $3_j$ combined with a reflective arrayed waveguide grating (or R-AWG) 24 or an echelle grating. The use of flat reflectors (RWINCs) $3j$ allows large wavelength windows.

The reflective arrayed waveguide grating 24 or echelle grating comprises at least one input connected to an input waveguide 25 defined on the substrate 1, at least two outputs connected respectively to output waveguides 26 defined on the substrate 1, and at least two inputs/outputs connected respectively to output ends of the primary waveguides $3_j$ via waveguides 27 defined on the substrate 1. In the non-limiting example illustrated in FIG. 9, the reflective arrayed waveguide grating 24 comprises one input connected to an input waveguide 25, four outputs connected respectively to four output waveguides 26, and seven inputs/outputs connected respectively to output ends of seven primary waveguides $3_j$ via seven waveguides 27. But the respective numbers of inputs, outputs and inputs/outputs of the reflective arrayed waveguide grating 24 could be different from the ones illustrated in FIG. 9.

The invention offers several advantages, amongst which:

the integration of reflectors with other integrated optical elements (or components), which is not the case when the reflector comprises cleaved facets, an extended wavelength window compare to the one offered by a loop reflector, an extended wavelength window and lower losses compare to the ones offered by a bragg reflector.

It should be appreciated by those skilled in the art that any block diagram herein represent conceptual views of illustrative circuitry embodying the principles of the invention.

The description and drawings merely illustrate the principles of the invention. It will thus be appreciated that those skilled in the art will be able to devise various arrangements that, although not explicitly described or shown herein, embody the principles of the invention and are included within its spirit and scope. Furthermore, all examples recited herein are principally intended expressly to be only for pedagogical purposes to aid the reader in understanding the principles of the invention and the concepts contributed by the inventor(s) to furthering the art, and are to be construed as being without limitation to such specifically recited examples and conditions. Moreover, all statements herein reciting principles, aspects, and embodiments of the invention, as well as specific examples thereof, are intended to encompass equivalents thereof.

The invention claimed is:

1. An optical device comprising a substrate on which is defined a unique primary waveguide consisting of two ending portions and a central portion, a loop that consists of the central portion of the unique primary waveguide and a first directional coupler, a second directional coupler formed by the ending portions of the unique primary waveguide, and a Mach-Zehnder interferometer intercalated between the first and second directional couplers, the Mach-Zehnder interferometer being arranged for compensating a wavelength dependence of the directional couplers.

2. The optical device according to claim 1, wherein the primary waveguide is a rib or strip waveguide defined onto a silicon substrate.

3. The optical device according to claim 2, wherein the rib or strip waveguide is made of silicon.

4. The optical device according to claim 3, wherein the rib waveguide has a full thickness between about 200 nm and about 500 nm, and an etched part with a local thickness between about 50 nm and about 500 nm and with a width between about 200 nm and about 800 nm.

5. The optical device according to claim 3, wherein the first directional coupler has a length between about 5 μm and about 200 μm, the second directional coupler has a length between about 5 μm and about 200 μm, and the Mach-Zehnder interferometer has a length between about 0.1 μm and about 2 μm.

6. An optical system comprising a first and a second optical device according to claim 1, each having an input/output end, a secondary waveguide comprising a gain section intercalated between a first end, connected to the input/output end of the first optical device and a second end, a ring resonator intercalated between the second end of the secondary waveguide and the input/output end of the second optical device, and a heating means defined over the ring resonator and arranged for controlling a filter peak wavelength of the ring resonator and for selecting a laser optical mode.

7. An optical system comprising a first and a second optical device according to claim 1, each having an input/output end, a secondary waveguide comprising a gain section intercalated between a first end, connected to the input/output end of the first optical device, and a second end, an intermediate waveguide comprising first and second ends, a first ring resonator with a wavelength spectral filtering and intercalated between the second end of the secondary waveguide and the first end of the intermediate waveguide for coupling the secondary waveguide to the intermediate waveguide, a first heating means defined over the first ring resonator and arranged for controlling a filter peak wavelength of the first ring resonator, a second ring resonator with a wavelength spectral filtering and intercalated between the second end of the intermediate waveguide and the input/output end of the second optical device, and a second heating means defined over the second ring resonator and arranged for controlling a filter peak wavelength of the second ring resonator.

8. The optical system according to claim 6, wherein the first optical device is a reflector with a reflection coefficient between about 80% and about 100%, and the second optical device is a reflector with a reflection coefficient between about 10% and about 60% and comprising an output for delivering photons.

9. The optical device according to claim 6, wherein the second optical device is a reflector with a reflection coefficient between about 80% and about 100%, and the first optical device is a reflector with a reflection coefficient between about 10% and about 60% and comprising an output for delivering photons.

10. The optical device according to claim 6 further comprising an integrated element selected from the group consisting of a semiconductor optical amplifier, a semiconductor electro absorption modulator, a silicon photonic modulator, a silicon photonic coherent mixer coupled to balanced photodiodes, and comprising an end connected to an output end of one of the first and second optical devices that is intended for delivering photons.

11. An optical system comprising at least two optical devices according to claim 1 and a reflective arrayed waveguide grating or an echelle grating comprising at least one input connected to an input waveguide, at least two outputs connected respectively to output waveguides and at least two inputs/outputs connected respectively to output ends of the optical devices via waveguides.

12. An optical device comprising a substrate on which is defined a primary waveguide and a secondary waveguide, each defining a loop reflector that includes first and second directional couplers, a Mach-Zehnder interferometer intercalated between the first and second directional couplers and arranged for compensating a wavelength dependence of the directional couplers, and an input/output end, wherein the secondary waveguide includes a gain section intercalated between a first end and connected to the input/output end of the first primary waveguide and a second end, a ring resonator intercalated between the second end of the secondary waveguide and the input/output end of the second primary waveguide, and a heater defined over the ring resonator and arranged for controlling a filter peak wavelength of the ring resonator and for selecting a laser optical mode.

13. The optical device according to claim 12, wherein the first primary waveguide is a reflector with a reflection coefficient between about 80% and about 100%, and the second primary waveguide is a reflector with a reflection coefficient between about 10% and about 60% and comprising an output for delivering photons.

14. The optical device according to claim 12, wherein the second primary waveguide is a reflector with a reflection coefficient between about 80% and about 100%, and the first primary waveguide is a reflector with a reflection coefficient between about 10% and about 60% and comprising an output for delivering photons.

15. The optical device according to claim 12 further comprising an integrated element selected from the group consisting of a semiconductor optical amplifier, a semiconductor electro absorption modulator, a silicon photonic modulator, a silicon photonic coherent mixer coupled to balanced photodiodes, and comprising an end connected to an output end of one of the first and second primary waveguides that is intended for delivering photons.

16. An optical device comprising a substrate on which is defined
a primary waveguide and a secondary waveguide, each defining a loop reflector that includes first and second directional couplers, a Mach-Zehnder interferometer intercalated between the first and second directional couplers and arranged for compensating a wavelength dependence of the directional couplers, and an input/output end, wherein the secondary waveguide includes a gain section intercalated between a first end and connected to the input/output end of the first primary waveguide and a second end,
an intermediate waveguide comprising first and second ends,
a first ring resonator with a wavelength spectral filtering and intercalated between the second end of the secondary waveguide and the first end of the intermediate waveguide for coupling the secondary waveguide to the intermediate waveguide,
a first heater defined over the first ring resonator and arranged for controlling a filter peak wavelength of the first ring resonator,
a second ring resonator with a wavelength spectral filtering and intercalated between the second end of the intermediate waveguide and the input/output end of the second primary waveguide, and
a second heater defined over the second ring resonator and arranged for controlling a filter peak wavelength of the second ring resonator.

17. An optical device comprising
a substrate on which is defined a unique primary waveguide consisting of two ending portions, a central portion, and two medium portions between the central portion and the ending portions;
a reflective loop that consists of the central portion of the unique primary waveguide and a first directional coupler;
a second directional coupler formed by the ending portions of the unique primary waveguide; and
a Mach-Zehnder interferometer intercalated between the first and second directional couplers, the Mach-Zehnder formed by the two medium portions of the unique primary waveguide; and
the Mach-Zehnder interferometer being arranged for compensating a wavelength dependence of the directional couplers.

18. The optical device according to claim 17, wherein the primary waveguide is a rib or strip waveguide defined onto a silicon substrate.

19. The optical device according to claim 18, wherein the rib or strip waveguide is made of silicon.

20. The optical device according to claim 19, wherein the rib waveguide has a full thickness between about 200 nm and about 500 nm, and an etched part with a local thickness between about 50 nm and about 500 nm and with a width between about 200 nm and about 800 nm.

21. The optical device according to claim 19, wherein the first directional coupler has a length between about 5 μm and about 200 μm, the second directional coupler has a length between about 5 μm and about 200 μm, and the Mach-Zehnder interferometer has a length between about 0.1 μm and about 2 μm.

* * * * *